US012730156B2

(12) United States Patent
Lu et al.

(10) Patent No.: US 12,730,156 B2
(45) Date of Patent: Sep. 8, 2026

(54) BATTERY CONDITION MONITORING SYSTEM AND METHOD FOR AN ENGINE START UP SYSTEM

(71) Applicant: Caterpillar Inc., Peoria, IL (US)

(72) Inventors: Yifeng Lu, Naperville, IL (US); Zhaoxu Dong, Dunlap, IL (US); Xuefei Hu, Dunlap, IL (US); Shiferaw Damtie Beyene, Peorias, IL (US); Yanchai Zhang, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 62 days.

(21) Appl. No.: 18/749,432

(22) Filed: Jun. 20, 2024

(65) Prior Publication Data

US 2025/0389779 A1 Dec. 25, 2025

(51) Int. Cl.

| | |
|---|---|
| ***G01R 31/389*** | (2019.01) |
| ***F02N 11/08*** | (2006.01) |
| ***G01R 31/36*** | (2020.01) |
| ***G01R 31/367*** | (2019.01) |
| ***G01R 31/3842*** | (2019.01) |

(52) U.S. Cl.

CPC ........ *G01R 31/389* (2019.01); *F02N 11/0862* (2013.01); *G01R 31/3647* (2019.01); *G01R 31/367* (2019.01); *G01R 31/3842* (2019.01); *F02N 2200/061* (2013.01); *F02N 2200/062* (2013.01); *F02N 2200/063* (2013.01); *F02N 2200/066* (2013.01)

(58) Field of Classification Search

CPC . G01R 31/389; G01R 31/3647; G01R 31/367

See application file for complete search history.

(56) References Cited

U.S. PATENT DOCUMENTS 7,619,417 B2 11/2009 Klang
7,962,300 B2 6/2011 Machiyama (Continued)

FOREIGN PATENT DOCUMENTS

CN 104569606 A 4/2015
CN 204495973 U 7/2015

(Continued)

OTHER PUBLICATIONS

Estimating motor current—technical discussion—vex forum. Vex Forum. (May 2012). https://www.vexforum.com/t/estimating-motor-current/21703 (Year: 2012).*

*Primary Examiner* — Christian Chace
*Assistant Examiner* — Minato Lee Horner

(57) ABSTRACT

Typically, mobile equipment, such as tractors and heavy duty machinery, require engine start up systems to provide a strong surge of power necessary for starting engines. Traditional engine start up systems use lead-acid batteries for providing an initial voltage. However, monitoring the condition of these batteries may not be possible without adding extra sensors. Disclosed embodiments allow a battery condition monitoring system to monitor the condition of the batteries within an engine start up system based on available parameters without the need of new sensors. In particular, embodiments determine the condition of a battery based on the resistance determined from these available parameters.

17 Claims, 6 Drawing Sheets

(56) References Cited

U.S. PATENT DOCUMENTS

| | | | | |
|---|---|---|---|---|
| 2006/0082375 | A1 * | 4/2006 | Coates | G01R 31/389<br>324/430 |
| 2007/0194791 | A1 * | 8/2007 | Huang | G01R 31/389<br>324/430 |
| 2019/0176639 | A1 * | 6/2019 | Kumar | G07C 5/0808 |
| 2019/0294173 | A1 * | 9/2019 | Szubbocsev | G05D 1/0274 |
| 2022/0146589 | A1 * | 5/2022 | Burchardt | H01M 10/48 |

FOREIGN PATENT DOCUMENTS

| | | | | |
|---|---|---|---|---|
| CN | 206657057 | U | 11/2017 | |
| CN | 116316935 | A | 6/2023 | |
| CN | 117498489 | A | 2/2024 | |
| DE | 102019211913 | B4 * | 8/2025 | B60L 3/12 |
| JP | 4193745 | B2 | 12/2008 | |
| JP | 6074759 | B2 | 2/2017 | |
| TW | 201215903 | A | 4/2012 | |

* cited by examiner

FIG. 3

BATTERY CONDITION MONITORING SYSTEM AND METHOD FOR AN ENGINE START UP SYSTEM

TECHNICAL FIELD

The embodiments described herein are generally directed to a battery condition monitoring system and method, and, more particularly, to battery condition monitoring system and method for an engine start up system in a mobile equipment.

BACKGROUND

Most engines, particularly those in mobile equipment, use batteries because they are reliable, cost-effective, and provide a strong surge of power necessary for starting engines. Batteries, like lead-acid batteries, are durable and have a relatively long lifespan, making them suitable for the frequent charging and discharging cycles typical in automotive applications. Currently, battery resistance is a critical physical parameter for monitoring batteries in engine start up systems. Most battery condition systems use high-frequency voltage, current, and temperature sensors to calculate resistance. However, the cost of installing additional sensors increases, especially with old models. The robustness of sensor measurements is also a concern. Thus, it is ideal to estimate the battery health condition without adding additional hardware-mounted sensors like current sensors.

Further, the extra sensors can increase the complexity of the system, which can lead to higher chances of malfunction and more difficult troubleshooting. The additional sensors may draw more power, potentially leading to faster battery depletion, especially in older or already strained batteries. This added load can also impact the overall efficiency and reliability of the startup process. This can result in increased maintenance needs and expenses over time. Lastly, the physical space required to install these sensors might pose a challenge, particularly in compact engine start up systems. For at least these reasons, a battery condition monitoring system can become inefficient and/or unfeasible. Accordingly, a battery condition monitoring system and method for an engine start up system has been developed to calculate the battery condition using existing components. For example, Chinese Patent Pub. No. CN204495973U, published on Jul. 22, 2015, and U.S. Pat. No. 7,962,300 B2, published on Jun. 14, 2011, describe lead acid battery health state detection apparatus, and Chinese Patent Pub. No. CN117498489A, published on Feb. 2, 2024, describes a lead-acid battery detection charger and system. The present disclosure is directed toward overcoming one or more of the problems discovered by the inventor.

SUMMARY

In an embodiment, a system for monitoring the condition of a battery, the system comprises: an engine start up system; a machine controller that includes a processor configured to receive one or more parameter values from the engine start up system; and a resistance estimator module, wherein the resistance estimator module is configured to receive data from the machine controller, determine a battery resistance value by dividing an offset voltage change by a steady-state current change, and calculate the battery condition based on a comparison of the determined output battery resistance with a long-term estimated battery resistance trace.

In an embodiment, a method for monitoring the condition of a battery, comprises: receiving one or more parameter values from an engine start up system, the parameters including data indicating a voltage drop from an initial voltage before the engine starts to an engine recovery steady battery voltage; determining a battery resistance value through a resistance estimator module by: dividing an offset voltage change by a steady-state current change, wherein the offset voltage change is determined by the voltage drop from an initial voltage before the engine starts to the engine recovery steady battery voltage, wherein the steady-state current change is determined with reference to a starter motor performance curve, and outputting the battery resistance value to calculate.

In an embodiment, a mobile equipment with a battery condition monitoring system to monitor an engine start up system, the battery condition monitoring system comprises: a resistance estimator module configured to receive one or more parameter values; determine an offset voltage change by determining a voltage drop from an initial voltage before the engine starts to an engine recovery steady battery voltage; determine a steady-state current change from a starter motor performance curve; and determine a battery resistance value by dividing the offset voltage change by the steady-state current change.

BRIEF DESCRIPTION OF THE DRAWINGS

The details of embodiments of the present disclosure, both as to their structure and operation, may be gleaned in part by study of the accompanying drawings, in which like reference numerals refer to like parts, and in which:

FIG. 3 illustrates a resistance estimation process of the data flow from a machine controller to a resistance estimator module, according to an embodiment;

DETAILED DESCRIPTION

Figure 1:
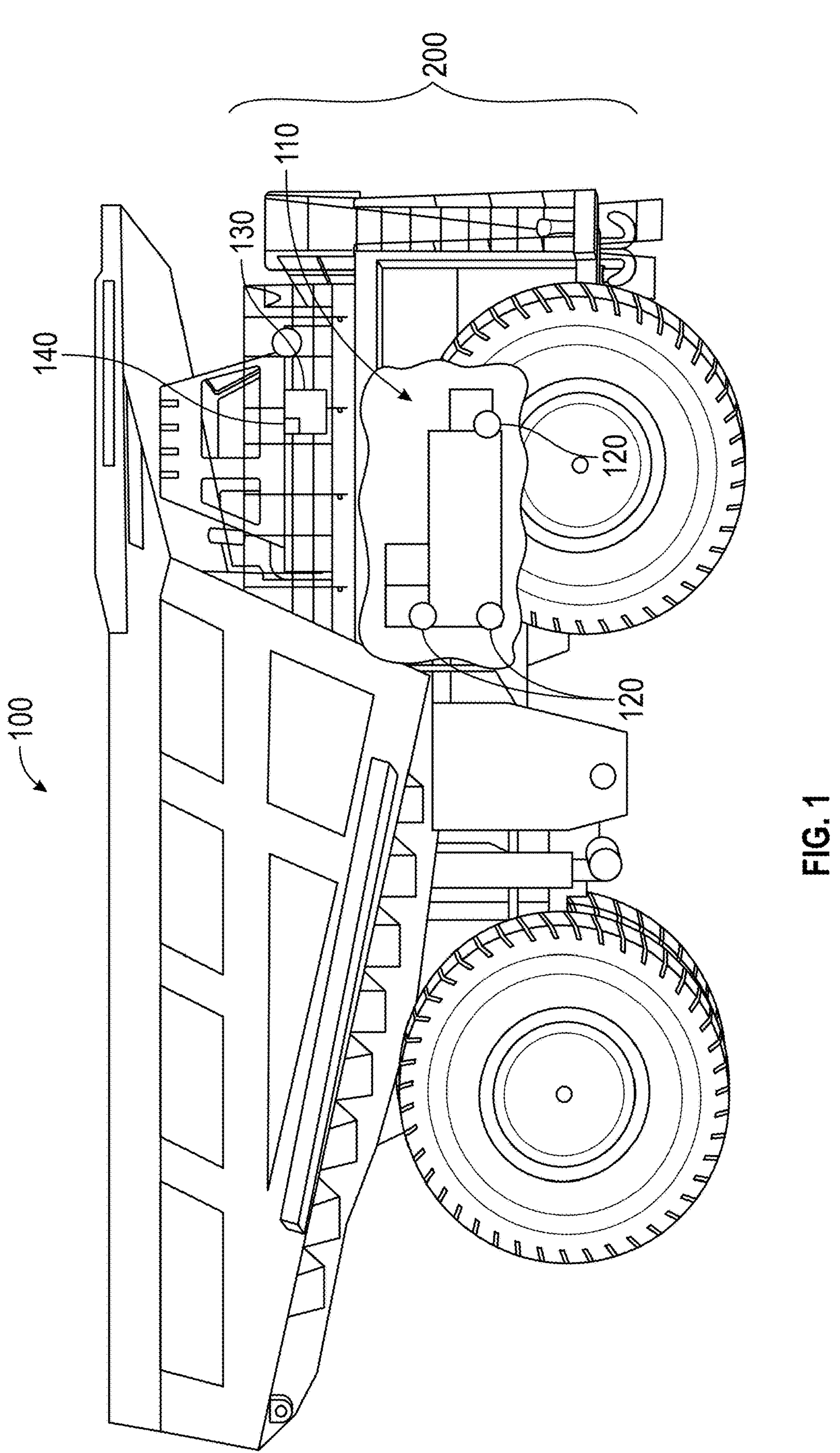
FIG. 1 illustrates a side view of a mobile equipment with battery condition monitoring system, according to an embodiment.

The detailed description set forth below, in connection with the accompanying drawings, is intended as a description of various embodiments, and is not intended to represent the only embodiments in which the disclosure may be practiced. The detailed description includes specific details for the purpose of providing a thorough understanding of the embodiments. However, it will be apparent to those skilled in the art that embodiments of the invention can be practiced without these specific details.

In some instances, well-known structures and components are shown in simplified form for brevity of description. For clarity and case of explanation, some surfaces and details may be omitted in the present description and figures. It should also be understood that the various components illustrated herein are not necessarily drawn to scale. In other words, the features disclosed in various embodiments may be implemented using different relative dimensions within and between components than those illustrated in the drawings.

FIG. 1 illustrates a side view of a mobile equipment 100 with a partial cutaway view exposing a battery condition monitoring system 200 within the mobile equipment, according to an embodiment. Mobile equipment 100 is illustrated as a mining truck. However, mobile equipment 100 may be any vehicle or engine that utilizes a battery condition monitoring system. Other examples of mobile equipment 100 include, without limitation, an excavator, dump truck, asphalt paver, backhoe loader, skid steer, track loader, cold planer, compactor, dozer, electric rope shovel, forest machine, hydraulic mining shovel, material handler, motor grader, pipe-layer, road reclaimer, telehandler, tractor-scraper, or the like. Mobile equipment 100 may be operated by a human (e.g., locally or remotely) and/or by an autonomous system.

In the illustrated example, mobile equipment 100 includes a battery condition monitoring system 200, which is configured to monitor battery 220 conditions in engine start up system 110 of mobile equipment 100. Battery condition monitoring system 200 comprises an engine start up system 110, which may include one or more sensors 120, a machine controller 130, and/or a resistance estimator module 140. For example, engine start up system 110 collects data from one or more existing sensors 120 integrated within engine start up system 110 components. The gathered data is then transmitted in real-time to machine controller 130. Machine controller 130 uses data to make informed decisions about fuel injection timing, ignition sequencing, and other operational adjustments necessary for a smooth and efficient engine start. Further, this real-time communication between existing sensors 120 in the components of engine start up system 110 and machine controller 130 provide data to resistance estimator module 140 to monitor the condition of engine start up system 110. Moreover, resistance estimator module 140 can be independent and/or separate from machine controller 130. It should be understood that the present embodiments may be compatible with any type of mobile equipment 100 or engine start up system 110.

Figure 2:
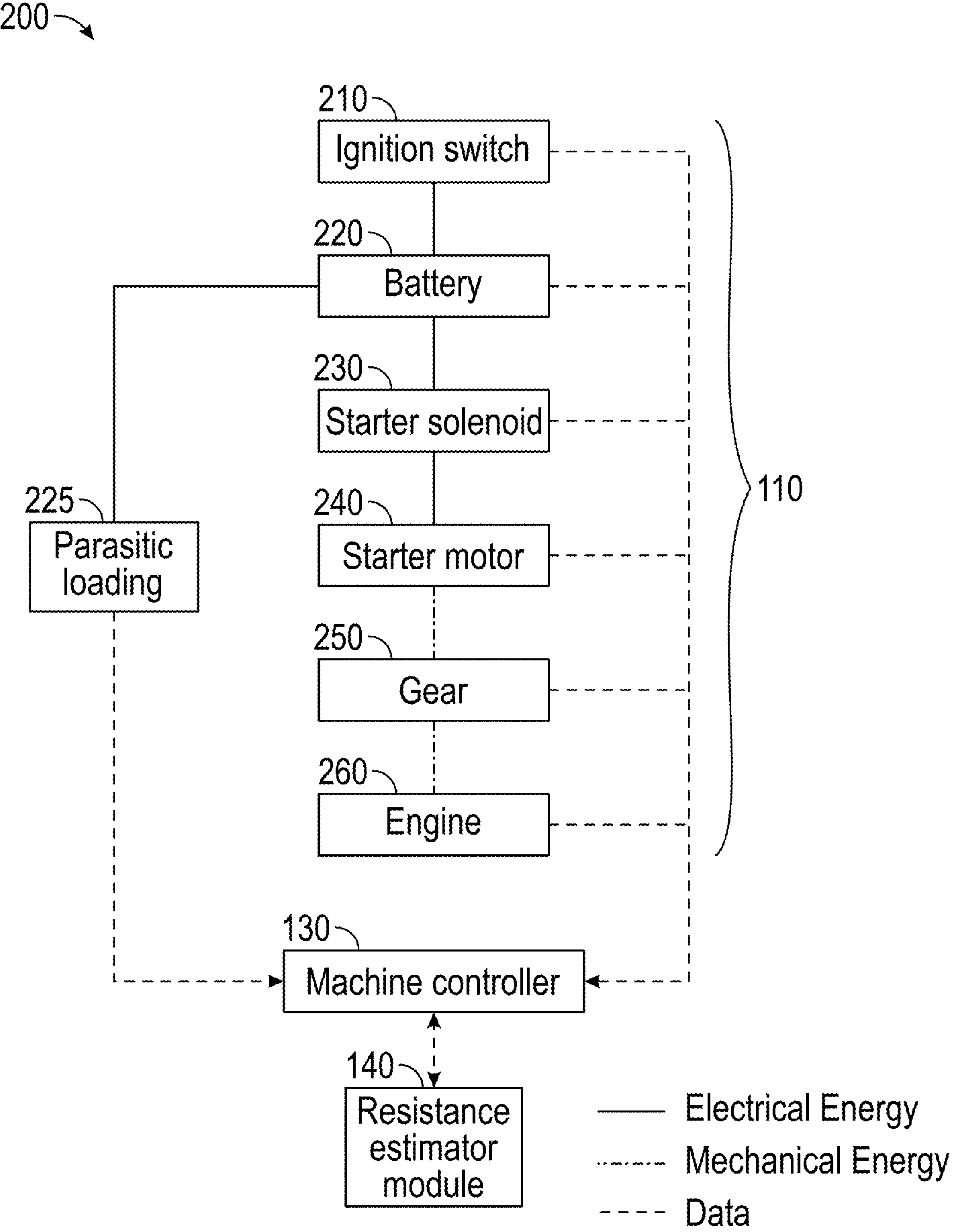
FIG. 2 illustrates a battery condition monitoring system, according to an embodiment.

Engine start up system 110 ensures reliable and efficient engine 260 ignition. Further, FIG. 2 illustrates in detail the components of engine start up system 110. Engine start up system 110 in mobile equipment 100 is designed to ensure the reliable and efficient initiation of engine 260. When the operator initiates the start command, engine start up system 110 engages and provides the necessary power to crank engine 260. Engine start up system 110 manages the entire process, from initial power supply to the transition of the engine into a running state. During this process, engine start up system 110 can monitor and adjust various parameters to optimize conditions for ignition and combustion, ensuring that engine 260 starts smoothly. Additionally, it continuously checks the status of engine 260, detecting any issues that could prevent a successful start and alerting the operator if necessary. This ensures both the safety and operational integrity of mobile equipment 100.

Engine start up system 110 communicates with machine controller 130 via sensors 120. Sensors 120 monitor critical parameters like temperature, initial voltage before starting, the steady state voltage at cranking, among others. Engine start up system 110 in mobile equipment 100 relies on a variety of inherent sensors 120 to ensure optimal performance and reliability. These sensors 120 provide critical data to machine controller 130, which uses this information to manage the start-up process effectively. Key sensors 120 can include the crankshaft position sensor, which monitors the position and rotational speed of the crankshaft to ensure proper timing for ignition and fuel injection. The temperature sensor measures the engine's temperature to adjust the fuel mixture and ignition timing, facilitating easier starts under varying temperature conditions. The oil pressure sensor checks the oil pressure to prevent engine start up if the pressure is too low, protecting the engine from potential damage. Additionally, battery 220 voltage sensor monitors battery's 220 charge level, ensuring there is sufficient power for cranking engine 260. These sensors 120 work together to provide real-time data, allowing machine controller 130 to make precise adjustments and ensure a smooth and safe engine 260 start-up.

Figure 6:
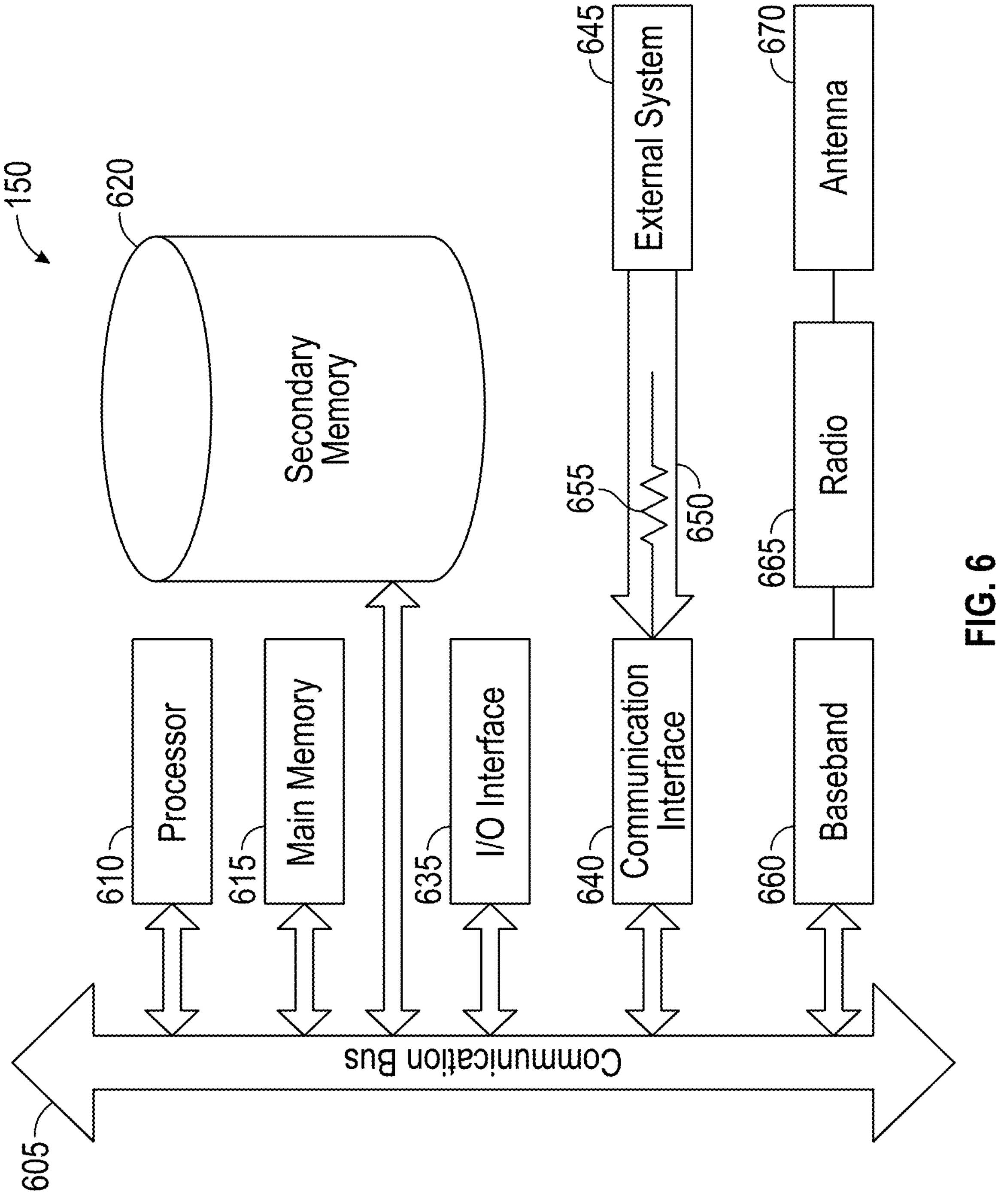
FIG. 6 illustrates an example architecture of a machine controller, according to an embodiment.

In battery condition monitoring system 200 for engine start up system 110, machine controller 130 ensures that engine 260 starts reliably by continuously assessing the parameters received from the different components within engine start up system 110. Further, FIG. 6 illustrates in detail the components of machine controller 130. Machine controller 130 receives real-time data from sensors 120 that monitor various battery parameters, such as voltage, current, and temperature.

The primary function of machine controller 130 is to analyze the data received to determine different states of engine start up system 110. Within resistance estimator module 140, the battery's 220 state of charge (SOC) and state of health (SOH) is estimated. The SOC indicates how much charge the battery currently holds, while the SOH assesses the overall condition and aging of the battery. By evaluating these metrics, machine controller 130 can predict battery's 220 ability to deliver the necessary power to starter motor 240 during the engine start up process. Additionally, machine controller 130 may manage charging processes and communicate with other systems to optimize battery performance and lifespan. For instance, it can regulate the alternator's output to ensure battery 220 is properly charged during engine 260 operation.

FIG. 2 illustrates a battery condition monitoring system 200, according to an embodiment. As previously mentioned in FIG. 1, battery condition monitoring system 200 comprises engine start up system 110, which may include one or more sensors 120, machine controller 130, and a resistance estimator module 140. In engine start up system 110, various sensors 120 collect real-time data on critical parameters such as battery voltage, engine temperature, oil pressure, and crankshaft position. This data is continuously fed to machine controller 130, which serves as the central processing unit for interpreting and managing this information. Machine controller 130 analyzes the incoming data to ensure all conditions are optimal for a successful engine 260 start. Once machine controller 130 processes this data and determines that engine 260 is ready to start, machine controller 130 transmits relevant information to resistance estimator module 140. Resistance estimator module 140 can be part of a broader management system, tasked with overseeing various operational aspects of the equipment. On the other hand, resistance estimator module 140 can be part of machine controller 130. Resistance estimator module 140 receives the processed data, which it uses to perform its functions described in FIG. 3.

For example, as part of battery condition monitoring system 200, engine start up system 110 can comprise an ignition switch 210, a battery 220 that provides power to engine start up system 110 and parasitic loading 225 components, a starter solenoid 230, a starter motor 240 mechanically connected to a gear 250, and an engine 260. In engine start up system 110, the process begins with ignition switch 210, activated by turning a key or pressing a button. This action closes a circuit, allowing current to flow from battery 220, the primary power source, to various components. The battery not only powers starter motor 240 but also supports parasitic loading 225, which includes power consumption by other mobile equipment 100 electronics like clocks and alarms, even when engine 260 is off. When ignition switch 210 is activated, current is directed to starter solenoid 230. Starter solenoid 230 acts as a switch, using a low current signal from the ignition to close a high current circuit, enabling a substantial current flow from battery 220 switchably in electrical communication to the starter motor 240.

After, starter motor 240 turns over engine 260 to initiate combustion. Attached to starter motor 240 is gear 250, which engages with the ring gear on engine's 260 flywheel. As starter motor 240 operates, it rotates gear 250, which in turn spins the ring gear, setting engine's 260 pistons in motion and starting the combustion process. Once engine 260 runs, it generates its own power, allowing starter motor 240 to disengage and gear 250 to retract. This coordinated sequence from ignition switch 210 to engine 260 operation ensures a smooth start-up, with parasitic loading 225 being a secondary but continuous draw on battery 220.

Further, FIG. 2 illustrates a data flow in machine controller 130, according to an embodiment. Machine controller 130 monitors parameters output by one or more sensors 120, such as a battery 220 temperature and voltage. Machine controller 130 may process these parameters. In particular, machine controller 130 may comprise one or more processors, which communicate with resistance estimator module 140 where process 300 is done. Resistance estimator module 140 may be part of machine controller 130 or a separate system. Further, resistance estimator module 140 can be in the form of software instructions and/or software updates that can be executed by one or more processors of machine controller 130. The processor(s) and/or map(s) may be used to derive inputs to process 300 from the values of the monitored parameters. Process 300 processes these inputs to produce a resistance estimation, which may communicate the resistance estimation with an offboard system or operator to alert if battery 220 needs a replacement.

Figure 3:
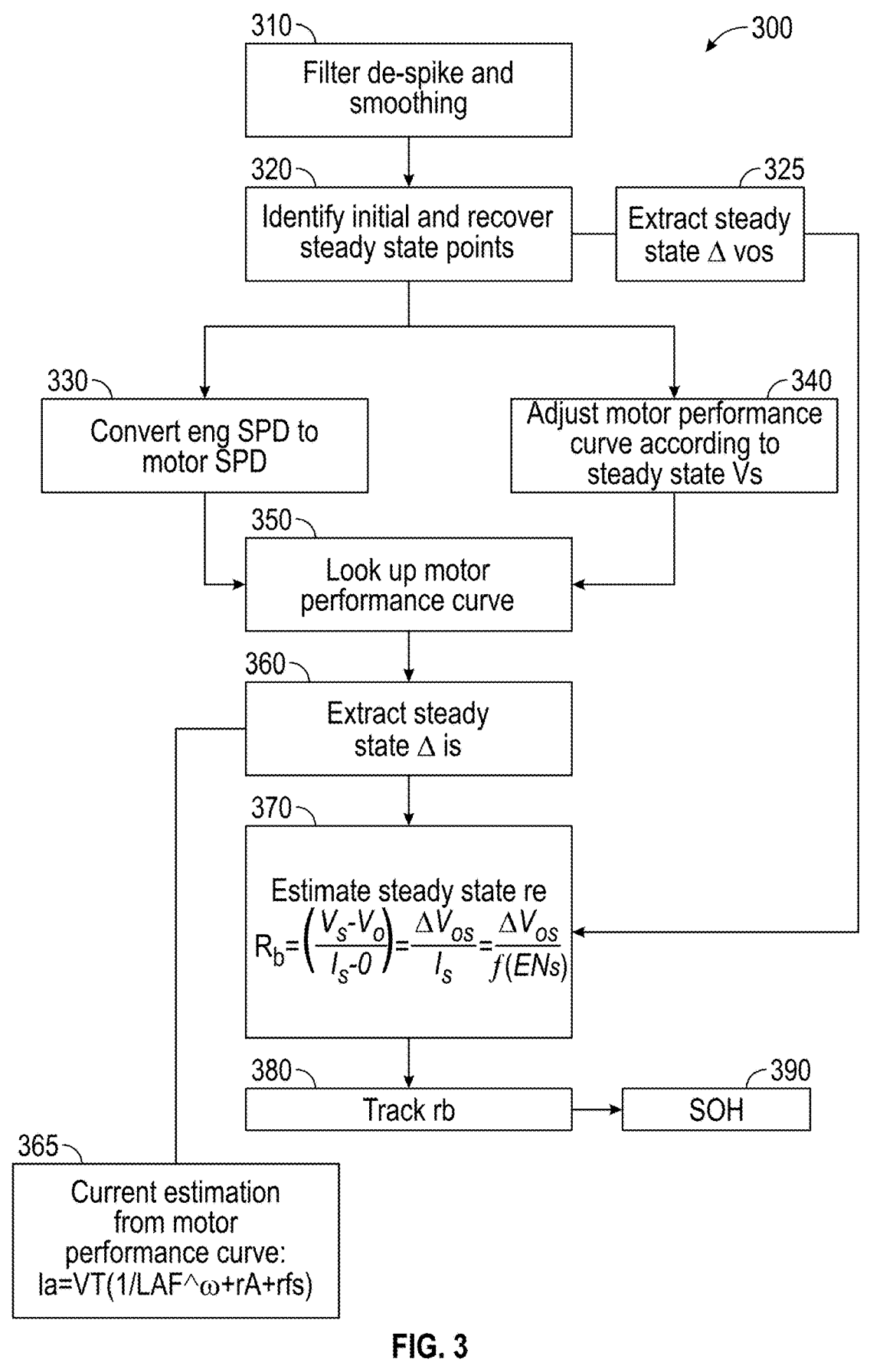
Figure 4:
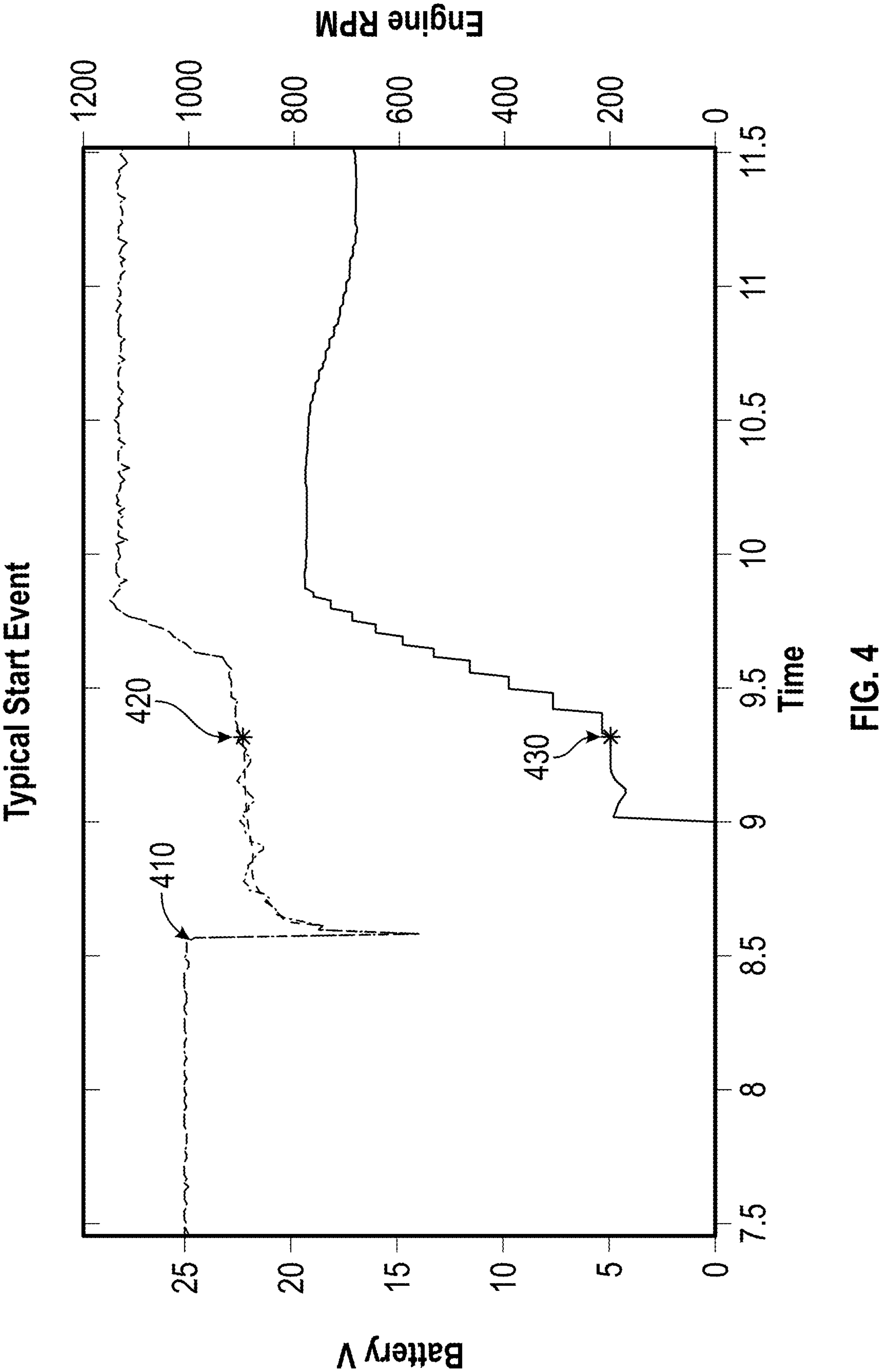
FIG. 4 illustrates parameters measured in a process for monitoring the battery condition in an engine start up system, according to an embodiment.

FIG. 3 illustrates a process 300 of the data flow from a machine controller 130 to a resistance estimator module 140, according to an embodiment. In simple terms, process 300 illustrates a battery condition monitoring system 200 that monitors start-up capability without adding high-frequency voltage, current, and temperature sensors. Through process 300, resistance estimator module 140 of battery condition monitoring system 200 calculates battery 220 resistance through the battery voltage drop from initial voltage 410 before engine 260 starts to engine's 260 recovery steady battery voltage 420, as shown in FIG. 4 below. The current is reversed calculated and converted from a known starter motor 240 performance curve, and the resistance is calculated from the voltage drop and current estimation from the motor performance curve. The resistance is calculated based on the voltage drop and current estimation from the motor performance curve. Based on the estimated battery 220 resistance, battery condition monitoring system 200 monitors battery 220 health condition and sends an alert to the operator on or offboard to a back office for battery 220 replacement or SOH of engine start up system 110.

In subprocess 310, resistance estimator module 140 filters the de-spike and smoothing from the parameters received from engine start up system 110. In battery condition monitoring system 200, filtering de-spike and smoothing parameters from engine start up system 110 can involve using signal processing techniques to ensure accurate measurements. Spikes, which are sudden disturbances of the parameters being received by resistance estimator module 140, can be removed using methods like median filtering or thresholding. Low-pass filters, such as Butterworth or RC filters, can be implemented to reduce high-frequency noise, smoothing rapid signal changes received by resistance estimator module 140 from engine start up system 110. Further, in subprocess 310, smoothing can be achieved using moving average or exponential moving average filters, which highlight longer-term trends and dampen short-term fluctuations.

In subprocess 320, resistance estimator module 140 identifies the initial and recovery state points. This means that resistance estimator module 140 interfacing with an engine start up system 110 receives the initial and recovery state points of parameters such as voltage, current, and temperature. Initially, in the pre-start state, battery 220 voltage is at its resting level, indicating the open-circuit voltage with minimal current draw and the temperature reflecting ambient conditions. During the cranking state, the voltage drops significantly due to the high current demand of the starter motor 240, leading to a spike in current as the battery provides the necessary power to turn over the engine. The temperature might slightly increase due to this high current flow. Once engine 260 starts, in the post-start state, the voltage begins to recover as the alternator charges battery 220, the current draw decreases from the peak cranking value to a lower level needed to recharge battery 220, and the temperature might continue to rise slightly due to ongoing charging and the warming engine 260. In the stable running state, the voltage stabilizes at a higher level as the alternator maintains a steady charging voltage, the current stabilizes to a lower steady-state value, and the temperature stabilizes, influenced by both the charging process and ambient engine 260 conditions. It should be noted that subprocess 320 can have a similar application to other parameters. The parameters mentioned are for illustration of subprocess 320 methodology.

In subprocess 325, offset voltage $V_{os}$ change is extracted to be used in the calculation of steady state resistance $R_b$. Offset voltage $V_{os}$ refers to a small, unintended voltage present at the output of battery 220 even when the input is zero. Offset voltage $V_{os}$ change can be determined by a voltage drop from an initial voltage 410 before the engine starts to an engine recovery steady battery voltage 420.

In subprocess 330, engine 260 speed parameter is converted motor speed 430 parameter. To convert engine 260 speed into motor speed 430, it is essential to understand the gear ratio in the mechanical linkage between the engine and the motor. Engine 260 speed, often measured in revolutions per minute (RPM), is transmitted to the motor through a series of gears 250 or a transmission system. Mathematically, the motor speed 430 (RPM) can be found by dividing engine 260 speed (RPM) by gear 250 ratio for gear reduction or multiplying by gear 250 ratio for gear 250 multiplication. Further, in subprocess 340, the motor performance curve is adjusted according to the steady state source voltage $V_s$. In subprocess 350, using both the motor speed 430 and the motor performance curve, the motor performance curve can be looked up in a typical performance curve from battery 220 manufacturer. By finding the motor performance curve, the steady-state current change ($I_s$) is determined based upon a starter motor 240 performance curve.

In subprocess 370, steady state resistance $R_b$ is determined by dividing offset voltage change ($V_{os}$) by a steady-state current change $I_s$. Further, steady state resistance $R_b$ is tracked in resistance estimator module 140, as shown in subprocess 380.

Figure 5:
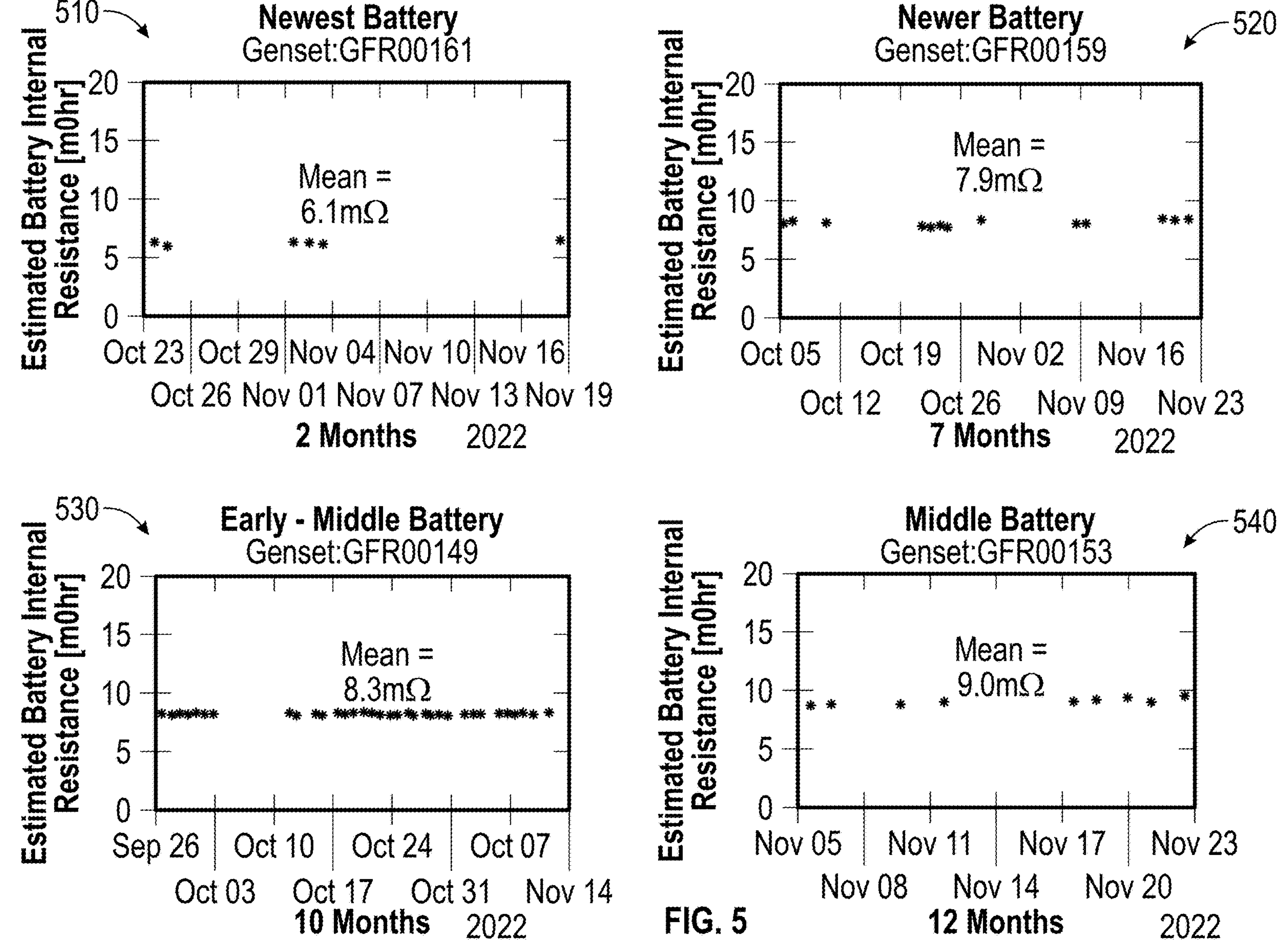
FIG. 5 illustrates maps of predetermined battery resistance values based on battery age, according to an embodiment.

In subprocess 390, by determining the SOH of battery 220 battery condition monitoring system 200 can determine whether battery 220 is ready to be replaced based upon the determined output battery 220 steady state resistance $R_b$ and generate an alert or communicate an offboard system if the determination is that battery 220 is ready to be replaced. SOH can be determined by comparing steady state resistance $R_b$ output from resistance estimator module 140 with a predetermined estimated battery resistance (as shown in FIG. 5). Further, this predetermined estimated battery resistance can include a long-term estimated battery resistance trace.

FIG. 4 illustrates parameters measured in a process for monitoring the battery condition in an engine start up system 110, according to an embodiment. The typical parameters measured in the start up event of a battery condition monitoring system 200 can include an initial voltage 410, a recovery steady battery voltage 420, and a motor speed 430 measured in revolutions per minute (RPM). While the battery condition monitoring system 200 measured parameters will primarily be described herein as specifying the particular parameters mentioned, it should be understood that a battery condition monitoring system 200 may specify different or additional parameters from the engine start up system 110.

Initial voltage 410 parameter serves as a reference point for determining the SOC of the battery, allowing battery condition monitoring system 200 to estimate the current charge level based on the known voltage when battery 220 is fully charged, partially charged, or discharged. This baseline is essential for comparing subsequent voltage readings, helping to assess battery's 220 performance by detecting how much the voltage drops over time and under different loads. Additionally, initial voltage 410 is instrumental in monitoring the battery's 220 health throughout its lifecycle, as significant deviations from the expected initial voltage 410 can indicate issues such as aging, capacity loss, or increased internal resistance.

Further, initial voltage 410 can help battery condition monitoring system 200 in engine start up system 110 by providing a clear indication of battery's 220 SOC, helping determine if battery 220 is sufficiently charged to start the engine. A fully charged battery 220 should have a specific initial voltage 410 that battery condition monitoring system 200 can use as a reference. Additionally, initial voltage 410 can predict battery's 220 ability to provide the necessary power to start engine 260, ensuring battery 220 has enough capacity to handle the high current draw required during engine 260 start-up.

Another parameter obtained through engine start up system 110 and used by battery condition monitoring system 200 is recovery steady battery voltage 420. Recovery steady battery voltage 420 is the voltage level of battery 220 when engine 260 is running at idle speed, with minimal electrical load and the alternator providing a steady charge. Recovery steady battery voltage 420 parameter can reflect battery's 220 voltage under typical operating conditions once initial voltage 410 surge of starting engine 260 has stabilized. Among other indicators, appropriate recovery steady battery voltage 420 can indicate proper maintenance and replenishment of the battery during engine 260 operation, essential for its longevity and reliability.

Additionally, recovery steady battery voltage 420 can help detect potential issues with battery 220 or charging system, such as a weak alternator, poor connections, or a battery failing to hold a charge. Monitoring steady-state idle voltage 420 consistently through battery condition monitoring system 200 can allow for the detection of gradual declines in battery 220 performance, enabling proactive maintenance or replacement before failure occurs. Furthermore, maintaining an optimal recovery steady battery voltage 420 can ensure that all electrical components receive the appropriate voltage, preserving their proper functioning and longevity. This supports the overall performance, efficiency, and safety of mobile equipment's 100 electrical system, preventing unexpected breakdowns and ensuring reliable operation.

Motor speed 430 refers to engine's 260 speed when it is running at a consistent and moderate rate, typically above idle but not at full throttle. Motor speed 430 is measured from engine's 260 crank speed (before it idles), and the gear 250 ratio. Motor speed 430 parameter is important because it represents engine's 260 operational state during normal driving conditions, where the alternator generates a steady and sufficient charge to power the mobile equipment's 100 electrical systems and recharge battery 220. Monitoring Motor speed 430 through battery condition monitoring system 200 can help ensure that engine 260 is running efficiently and that the alternator is providing a consistent output. Additionally, by comparing the voltage output at steady-state motor speed 430 to expected values, battery condition monitoring system 200 can detect issues such as an underperforming alternator, a failing battery 220, or engine start up system 110 inefficiencies.

FIG. 5 illustrates maps of predetermined battery resistance values based on battery age, according to an embodiment. The predetermined battery resistance values shown are newest battery 510 (about 2 months of use), newer battery 520 (about 7 months of use), early-middle battery 530 (about 10 months of use), and middle battery 540 (about 12 months of use). The resistance of battery 220 can vary depending on its age, condition, and usage history. In general, newest battery 510 typically has the lowest resistance among the four categories shown in FIG. 5. This is because newest battery 510 contains fresh, fully active materials with minimal degradation, allowing for efficient electron flow and low internal resistance. As a result, newest battery 510 can deliver higher currents with less voltage drop, making it highly efficient and capable of providing optimal performance.

Newer battery 520, while not brand new, still maintains relatively low resistance compared to older batteries. Newer battery 520 has undergone less degradation and wear compared to an early-middle battery 530 or middle-aged battery 540. Therefore, while it may not perform as efficiently as a new battery 510, it can still provide adequate power output and recharge efficiently. However, as a battery 220 ages, the internal resistance gradually increases due to factors such as chemical changes in the electrode materials, buildup of internal resistance from repeated charge and discharge cycles, and physical degradation of internal components.

Early-middle battery 530 is in the transitional phase between a newer battery 520 and a middle-aged battery 540. Its internal resistance is higher than that of newest battery 510 or newer battery 520 but lower than that of a middle-aged battery 540. At this stage, battery 220 may start to exhibit signs of reduced performance compared to when it was newer. While it can still deliver power and recharge, its efficiency may be slightly compromised compared to a newer battery 520. Additionally, an early-middle battery 530 may experience more voltage drop under load and may take longer to recharge fully.

Middle battery 540 is typically characterized by significantly higher internal resistance compared to newer battery 520 or early-middle battery 530. Middle battery 540 has undergone substantial degradation and wear, resulting in reduced performance and efficiency. Middle battery 540 may struggle to deliver power under heavy loads, experience noticeable voltage drop during operation, and take longer to recharge. As battery 220 continues to age, its internal resistance will continue to increase, eventually leading to decreased capacity, reduced runtime, and ultimately, failure.

The predetermined resistance values of battery 220 serve as valuable indicators to determine the stage of battery's 220 life cycle. These values provide insights into the internal condition of battery 220 and can help assess its overall health and performance. As battery 220 ages, internal resistance gradually increases. The predetermined resistance values act as thresholds to identify when battery's 220 internal resistance begins to deviate from its initial baseline, signaling the transition from a healthy state to a more mature stage. If the measured resistance exceeds these predetermined thresholds by a significant margin, it indicates that battery 220 has entered the middle to end of its life stage, characterized by reduced performance and efficiency.

FIG. 6 illustrates an example architecture of a machine controller 130, according to an embodiment. Controller 130 may comprise one or more processors 610. Processor(s) 610 may comprise a central processing unit (CPU). Additional processors may be provided, such as a graphics processing unit (GPU), an auxiliary processor to manage input/output, an auxiliary processor to perform floating-point mathematical operations, a special-purpose microprocessor having an architecture suitable for fast execution of signal-processing algorithms (e.g., digital-signal processor), a subordinate processor (e.g., back-end processor), an additional microprocessor or controller for dual or multiple processor systems, and/or a coprocessor. Such auxiliary processors may be discrete processors or may be integrated with a main processor 610. Examples of processors which may be used with controller 130 include, without limitation, any of the processors (e.g., Pentium™, Core i7™, Xeon™, etc.) available from Intel Corporation of Santa Clara, California, any of the processors available from Advanced Micro Devices, Incorporated (AMD) of Santa Clara, California, any of the processors (e.g., A series, M series, etc.) available from Apple Inc. of Cupertino, any of the processors (e.g., Exynos™) available from Samsung Electronics Co., Ltd., of Seoul, South Korea, any of the processors available from NXP Semiconductors N.V. of Eindhoven, Netherlands, and/or the like.

Processor 610 may be connected to a communication bus 605. Communication bus 605 may include a data channel for facilitating information transfer between storage and other peripheral components of machine controller 130. Furthermore, communication bus 605 may provide a set of signals used for communication with processor 610, including a data bus, address bus, and/or control bus (not shown). Communication bus 605 may comprise any standard or non-standard bus architecture such as, for example, bus architectures compliant with industry standard architecture (ISA), extended industry standard architecture (EISA), Micro Channel Architecture (MCA), peripheral component interconnect (PCI) local bus, standards promulgated by the Institute of Electrical and Electronics Engineers (IEEE) including IEEE 488 general-purpose interface bus (GPIB), IEEE 696/S-100, and/or the like.

Machine controller 130 may comprise main memory 615. Main memory 615 provides storage of instructions and data for programs executing on processor 610, such as one or more of the processes or functions discussed herein. It should be understood that programs stored in the memory and executed by processor 610 may be written and/or compiled according to any suitable language, including without limitation C/C++, Java, JavaScript, Perl, Python, Visual Basic, .NET, and the like. Main memory 615 is typically semiconductor-based memory such as dynamic random access memory (DRAM) and/or static random access memory (SRAM). Other semiconductor-based memory types include, for example, synchronous dynamic random access memory (SDRAM), Rambus dynamic random access memory (RDRAM), ferroelectric random access memory (FRAM), and the like, including read only memory (ROM).

Machine controller 130 may comprise secondary memory 620. Secondary memory 620 is a non-transitory computer-readable medium having computer-executable code and/or other data (e.g., software implementing any process or function described herein) stored thereon. In this description, the term "computer-readable medium" is used to refer to any non-transitory computer-readable storage media used to provide computer-executable code and/or other data to or within controller 130. The computer software stored on secondary memory 620 is read into main memory 615 for execution by processor 610. Secondary memory 620 may include, for example, semiconductor-based memory, such as programmable read-only memory (PROM), erasable programmable read-only memory (EPROM), electrically erasable read-only memory (EEPROM), and flash memory (block-oriented memory similar to EEPROM).

Machine controller 130 may comprise an input/output (I/O) interface 635. I/O interface 635 provides an interface between one or more components of controller 130 and one or more input and/or output devices. For example, I/O interface 635 may receive the output of one or more sensors, and/or output control signals to one or more of the components of mobile equipment 100.

Machine controller 130 may comprise communication interface 640. Communication interface 640 allows signals, such as data and software, to be transferred between machine controller 130 and external devices, networks, or other information sources and/or destinations (e.g., receiver (s)). For example, computer-executable code and/or data may be transferred to machine controller 130, over one or more networks, from a network server via communication interface 640. Examples of communication interface 640 include a built-in network adapter, network interface card (NIC), Personal Computer Memory Card International Association (PCMCIA) network card, card bus network adapter, wireless network adapter, Universal Serial Bus (USB) network adapter, modem, a wireless data card, a communications port, an infrared interface, an IEEE 1394 fire-wire, and any other device capable of interfacing machine controller 130 with a network or another computing device. Communication interface 640 preferably implements industry-promulgated protocol standards, such as Ethernet IEEE 802 standards, Fiber Channel, digital subscriber line (DSL), asynchronous digital subscriber line (ADSL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on, but may also implement customized or non-standard interface protocols as well.

Software transferred via communication interface 640 is generally in the form of electrical communication signals 655. These signals 655 may be provided to communication interface 640 via a communication channel 650 between communication interface 640 and an external system 645. In an embodiment, communication channel 650 may be a wired or wireless network, or any variety of other communication links. Communication channel 650 carries signals 655 and can be implemented using a variety of wired or wireless communication means including wire or cable, fiber optics, conventional phone line, cellular phone link, wireless data communication link, radio frequency ("RF") link, or infrared link, just to name a few.

Computer-executable code is stored in main memory 615 and/or secondary memory 120. Computer-executable code can also be received from an external system 645 via communication interface 640 and stored in main memory 615 and/or secondary memory 620. Such computer-executable code, when executed by processor(s) 610, enable machine controller 130 to perform the various processes or functions disclosed herein.

INDUSTRIAL APPLICABILITY

In some industrial contexts, such as construction, mining, farming, forestry, and the like, mobile equipment 100 may operate with engines 260 that use batteries 220 for their engine start up systems 110. Batteries 220, like lead-acid batteries, are durable and have a relatively long lifespan, making them suitable for the frequent charging and discharging cycles typical in automotive applications. Currently, battery 220 resistance is a critical physical parameter for monitoring batteries 220 in engine start up systems 110. Thus, it is of great benefit to have a system that can detect the current life-stage of battery 220 and predict potential problems and/or replacement needs.

Accordingly, a battery condition monitoring system 200 is disclosed. Battery condition monitoring system 200 includes engine start up system 110, which may include one or more sensors 120, machine controller 130, and a resistance estimator module 140. In engine start up system 110, various sensors 120 collect real-time data on critical parameters such as battery voltage, engine temperature, oil pressure, and crankshaft position. This data is continuously fed to machine controller 130, which serves as the central processing unit for interpreting and managing this information. These input parameters may be provided to a process 300 to determine the current state of battery 220 life. Process 300 may optimize the efficiency of mobile equipment's 100 engine start up system 110, based on the input parameters, by monitoring the condition of battery 220.

It will be understood that the benefits and advantages described above may relate to one embodiment or may relate to several embodiments. Aspects described in connection with one embodiment are intended to be able to be used with the other embodiments. Any explanation in connection with one embodiment applies to similar features of the other embodiments, and elements of multiple embodiments can be combined to form other embodiments. The embodiments are not limited to those that solve any or all of the stated problems or those that have any or all of the stated benefits and advantages.

The preceding detailed description is merely exemplary in nature and is not intended to limit the invention or the application and uses of the invention. The described embodiments are not limited to usage in conjunction with a particular type of machine. Hence, although the present embodiments are, for convenience of explanation, depicted and described as being implemented in mobile equipment 100, it will be appreciated that it can be implemented in various other types of machines, including non-mobile equipment, and in various other systems and environments. Furthermore, there is no intention to be bound by any theory presented in any preceding section. It is also understood that the illustrations may include exaggerated dimensions and graphical representation to better illustrate the referenced items shown, and are not considered limiting unless expressly stated as such.

What is claimed is:

1. A system for monitoring the condition of a battery, the system comprising:

an engine start up system including an engine and an engine speed sensor;

a machine controller that includes a processor configured to receive one or more parameter values from the engine start up system; and a resistance estimator module included in the machine controller or separate from the machine controller, wherein the resistance estimator module is configured to receive data including an engine speed value of the engine from the engine speed sensor, determine a battery resistance value by dividing an offset voltage change by a steady-state current change, the steady-state current change based in part on the engine speed value and in accordance with a gear ratio associated of the engine, calculate the battery condition based on a comparison of the determined output battery resistance with a long-term estimated battery resistance trace, and based on the battery condition, generate an alert associated with the battery.

2. The system for monitoring the condition of a of claim 1, wherein the resistance estimator module is further configured to determine whether the battery is ready to be replaced based upon the determined output battery resistance.

3. The system for monitoring the condition of a battery of claim 1, wherein the system for monitoring the condition of a battery communicates an offboard system if the battery needs a replacement.

4. The system for monitoring the condition of a battery of claim 1, wherein the offset voltage change is determined by a voltage drop from an initial voltage before the engine starts to an engine recovery steady battery voltage.

5. The system for monitoring the condition of a battery of claim 1, wherein the steady-state current change is determined based upon a starter motor performance curve.

6. The system for monitoring the condition of a battery of claim 5, wherein the starter motor performance curve is calculated by converting a motor speed parameter obtained from the engine start up system.

7. The system for monitoring the condition of a battery of claim 1, wherein the engine start up system comprises:

the battery configured to supply electrical power to the engine start up system; and a starter motor configured to initiate the operation of the engine, the starter motor configured to be switchably in electrical communication with the battery.

8. The system for monitoring the condition of a battery of claim 6, wherein the parameter values received by the machine controller comprise temperature, voltage, current, and state of charge of the battery associated with the engine.

9. The system for monitoring the condition of a battery of claim 1, wherein the condition of the battery is further determined by comparing the battery resistance and predetermined values based on the battery age.

10. A method for monitoring the condition of a battery in a system having an engine and an engine speed sensor, comprising:

receiving one or more parameter values from an engine start up system, the parameters including data indicating a voltage drop from an initial voltage before the engine starts to an engine recovery steady battery voltage and an engine speed value of the engine from the engine speed sensor;

determining a battery resistance value through a resistance estimator module by:

dividing an offset voltage change by a steady-state current change, wherein the offset voltage change is determined by the voltage drop from an initial voltage before the engine starts to the engine recovery steady battery voltage, wherein the steady-state current change is based in part on the engine speed value and in accordance with a gear ratio associated of the engine, and outputting the battery resistance value to calculate the battery condition, and based on the battery condition, generating an alert that is associated with the battery.

11. The method of claim 10, further comprising determining whether the battery is ready to be replaced based on the determined output battery resistance.

12. The method of claim 10, further comprising communicating with an offboard system if the battery needs replacement.

13. The method of claim 10, wherein the engine recovery steady battery voltage is a subsequent voltage output by the battery when the engine is running at idle speed.

14. The method of claim 13, wherein the steady-state current change is further determined based upon a starter motor performance curve.

15. The method of claim 14, wherein the starter motor performance curve is calculated by converting a motor speed parameter obtained from the engine start up system.

16. The method of claim 10, wherein the engine start up system comprises:

the battery configured to supply electrical power to the engine start up system; and a starter motor configured to initiate the operation of the engine, the starter motor being configured to be switchably in electrical communication with the battery.

17. The method of claim 15, wherein the parameter values received comprise temperature, voltage, current, and state of charge of the battery associated with the engine.

* * * * *